United States Patent
Wang

(10) Patent No.: US 9,899,629 B2
(45) Date of Patent: Feb. 20, 2018

(54) ORGANIC LIGHT-EMITTING DIODE DISPLAY PANEL AND DISPLAY APPARATUS

(71) Applicants: BOE TECHNOLOGY GROUP CO., LTD., Beijing (CN); BOE (Hebei) Mobile Display Technology Co., Ltd., GuAn, Hebei (CN)

(72) Inventor: Dapeng Wang, Beijing (CN)

(73) Assignees: BOE TECHNOLOGY GROUP CO., LTD., Beijing (CN); BOE (Hebei) Mobile Display Technology Co., Ltd., Heibei (CN)

( * ) Notice: Subject to any disclaimer, the term of this patent is extended or adjusted under 35 U.S.C. 154(b) by 0 days.

(21) Appl. No.: 15/204,686

(22) Filed: Jul. 7, 2016

(65) Prior Publication Data

US 2017/0110684 A1    Apr. 20, 2017

(30) Foreign Application Priority Data

Oct. 19, 2015  (CN) .......................... 2015 1 0679961

(51) Int. Cl.
  *H01L 51/52*  (2006.01)
  *H01L 27/32*  (2006.01)

(52) U.S. Cl.
  CPC ........ *H01L 51/5253* (2013.01); *H01L 27/323* (2013.01); *H01L 27/3276* (2013.01)

(58) Field of Classification Search
  CPC . H01L 51/52; H01L 51/5253; H01L 51/5262; H01L 51/5271
  See application file for complete search history.

(56) References Cited

U.S. PATENT DOCUMENTS

| | | | | |
|---|---|---|---|---|
| 2009/0079336 A1* | 3/2009 | Yamada | .............. | H01L 51/5265 313/504 |
| 2014/0130339 A1* | 5/2014 | Shin | ...................... | G06F 3/0412 29/592.1 |
| 2014/0132856 A1* | 5/2014 | Hung | ...................... | C03C 25/10 349/12 |
| 2015/0003040 A1* | 1/2015 | Bessho | ............... | H01L 51/5262 362/84 |
| 2016/0093596 A1* | 3/2016 | Hong | .................... | H01L 25/167 257/72 |

FOREIGN PATENT DOCUMENTS

| | | |
|---|---|---|
| CN | 101790712 A | 7/2010 |
| CN | 102810018 A | 12/2012 |
| CN | 103050506 A | 4/2013 |
| CN | 103872092 A | 6/2014 |
| CN | 104868060 A | 8/2015 |

OTHER PUBLICATIONS

First Chinese Office Action, for Chinese Patent Application No. 201510679961.4, dated Sep. 5, 2017, 12 pages.

* cited by examiner

*Primary Examiner* — Phuc Dang
(74) *Attorney, Agent, or Firm* — Kinney & Lange, P.A.

(57) ABSTRACT

An organic light-emitting diode display panel includes a lower substrate; an upper substrate; and an organic light-emitting diode structure formed between the lower substrate and the upper substrate. A side of the organic light-emitting diode structure facing towards the upper substrate is a light output side, and the upper substrate is a strengthened glass plate, subjected to a strengthening processing, which serves as a protective glass plate as an outermost layer of the organic light-emitting diode display panel.

19 Claims, 2 Drawing Sheets

ORGANIC LIGHT-EMITTING DIODE DISPLAY PANEL AND DISPLAY APPARATUS

CROSS-REFERENCE TO RELATED APPLICATION

This application claims the benefit of Chinese Patent Application No. 201510679961.4 filed on Oct. 19, 2015 in the State Intellectual Property Office of China, the whole disclosure of which is incorporated herein by reference.

BACKGROUND

Technical Field

Embodiments of the present invention relate to the field of display, and particularly to an organic light-emitting diode display panel and a display apparatus.

Description of the Related Art

In a conventional organic light-emitting diode display panel, in order to improve its use reliability, it is necessary to dispose a protective glass plate on a light output side of the display panel to prevent the display panel from being damaged by suffering from an impact of an external force so as to decrease display effect. Generally, the protective glass plate is made of a glass plate having a relatively high hardness and relatively strong impact resisting capability, and is bonded on the light output side of the display panel. During manufacturing of the display panel, the number of technology steps is increased due to a step of bonding the protective glass plate and the number of parts and components of the display panel is increased, while a thickness of the display panel is increased, which is unfavourable to lightening and thinning of a product. Since the protective glass plate is additionally disposed on the display panel, a transmittance of visible light and thus display effect of the display panel are reduced.

SUMMARY

Embodiments of the present invention provide an organic light-emitting diode display panel comprising: a lower substrate, an upper substrate and an organic light-emitting diode structure formed between the lower substrate and the upper substrate, wherein a side of the organic light-emitting diode structure facing towards the upper substrate is a light output side, and the upper substrate is a strengthened glass plate, subjected to a strengthening processing, which serves as a protective glass plate as an outermost layer of the organic light-emitting diode display panel.

Embodiments of the present invention further provide a display apparatus comprising the abovementioned organic light-emitting diode display panel.

LIST OF REFERENCE NUMERALS

10: lower glass substrate; 20: upper glass substrate; 21: hole for telephone receiver; 22: hole for camera or pick-up head; 23: hole for key; 30: organic light-emitting diode structure; 31: cathode; 32: organic functional layer; 321: electron injection layer; 322: light emitting layer; 323: hole injection layer; 33: anode; 40: touch control functional layer; 41: first transparent electrode layer; 42: first transparent electrical insulation layer; 43: second transparent electrode layer; 44: second transparent electrical insulation layer; 50: protective layer

DETAILED DESCRIPTION OF THE EMBODIMENTS

A further description of the invention will be made in detail as below with reference to embodiments of the present invention taken in conjunction with the accompanying drawings. The following embodiments are intended to explain the present invention and the present invention should not be construed as being limited to the embodiment set forth herein.

Figure 1:
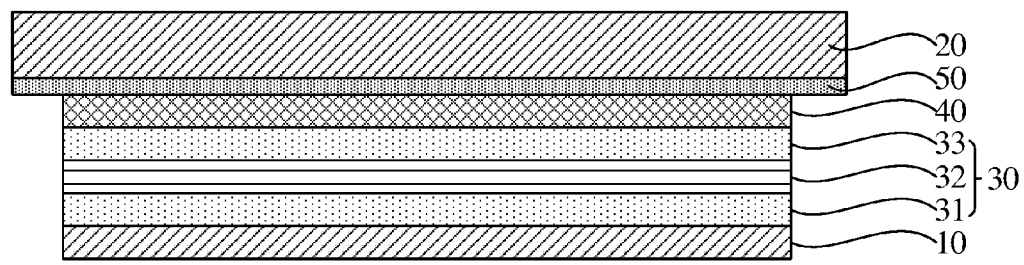
FIG. 1 is a schematic diagram showing a configuration of an organic light-emitting diode display panel according to an embodiment of the present invention.

As shown in FIG. 1, embodiments of the present invention provide an organic light-emitting diode display panel. The organic light-emitting diode display panel comprises: a lower glass substrate 10, an upper glass substrate 20 and an organic light-emitting diode structure 30 formed between the lower glass substrate 10 and the upper glass substrate 20. A side of the organic light-emitting diode structure 30 facing towards the upper glass substrate 20 is a light output side, and the upper substrate 20 is a strengthened glass plate, subjected to a strengthening processing, which serves as a protective glass plate as an outermost layer of the organic light-emitting diode display panel.

In actual production, the upper glass substrate 20 may be strengthened by means of any appropriate method. For example, the upper glass substrate 20 may be strengthened by means of a chemical surface strengthening processing method. Chemical strengthening of a glass plate is a technology in which compositions of the glass plate within a surface region (generally within a depth of hundreds of microns) are changed and thus microcracks in a surface of the glass plate are eliminated or a compressive stress layer are formed in the surface of the glass plate, by virtue of migration and diffusion of ions in the surface of the glass plate, so that strength of the glass plate is improved. A specific method of strengthening the upper glass substrate 20 as an example is as follows. A glass plate ready to be strengthened is placed into a high-purity potassium nitrate solution mixed with catalyst. Then, the potassium nitrate solution is heated to about 420° C. so that sodium ions in the surface of the glass plate are exchanged with potassium ions to form a strengthened layer.

In the embodiments of the present invention, the compressive stress layer of the upper glass substrate 20 subjected to the strengthening processing has a depth of about 50 μm, and a bending strength which reaches 600-800 MPa, so as to achieve better scratch resistance and bending resistance to satisfy normal use requirements.

In the organic light-emitting diode display panel, the upper glass substrate 20 on the light output side of the organic light-emitting diode structure is the strengthened glass plate, subjected to the strengthening processing, which directly serves as the outermost layer of the organic light-emitting diode display panel, to function as a protective glass plate of a common organic light-emitting diode display panel. Therefore, in the organic light-emitting diode display panel according to the embodiments of the present invention, a protective glass plate and a bonding layer for bonding the protective glass plate, which would otherwise be provided, are omitted, which facilitates thinning design of the organic light-emitting diode display panel and reduces attenuation of light emitted by the organic light-emitting diode structure and thus improves display effect of a product.

In the embodiment shown in FIG. 1, the display panel further comprises a touch control functional layer 40 disposed on a side of the upper glass substrate 20 facing towards the organic light-emitting diode structure 30.

In this organic light-emitting diode display panel, the touch control functional layer is integrated with the upper glass substrate. Therefore, a separate touch control layer is omitted, and thus a thickness of the display panel is decreased, facilitating thinning design of the organic light-emitting diode display panel and reducing attenuation of light emitted by the organic light-emitting diode structure and thus improving display effect of a product.

In embodiments of the present invention, the touch control functional layer is a capacitive touch control functional layer, a resistive touch control functional layer or an infrared touch control functional layer.

Figure 2:
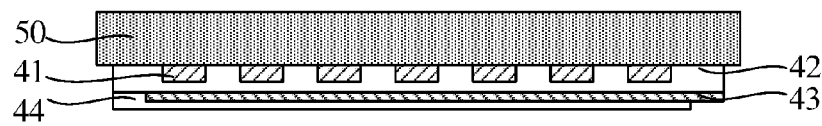
FIG. 2 is a schematic diagram showing a configuration of a touch control functional layer shown in FIG. 1.

Specifically, as shown in FIG. 2, when the touch control functional layer 40 is a capacitive touch control functional layer, the touch control functional layer 40 comprises a first transparent electrode layer 41, a first transparent electrical insulation layer 42, a second transparent electrode layer 43 and a second transparent electrical insulation layer 44. The first transparent electrode layer 41, the first transparent electrical insulation layer 42 and the second transparent electrode layer 43 constitute an array of plate capacitors.

The first transparent electrode layer 41 and the second transparent electrode layer 43 each comprise strip electrodes arranged in parallel. The strip electrodes of the first transparent electrode layer 41 and the strip electrodes of the second transparent electrode layer 43 are orthogonal to each other. Each of the first transparent electrical insulation layer 42 and the second transparent electrical insulation layer 44 is a transparent film made of silicon dioxide and having a thickness of 40-50 nm, and each of the first transparent electrode layer 41 and the second transparent electrode layer 43 is a transparent film made of indium tin oxide or zinc tin oxide and having a thickness of 80-100 nm.

In embodiments of the present invention, in order to ensure a strength of the upper glass substrate, the upper glass substrate may be a glass substrate made of tempered glass plate, and as shown in FIG. 1, a surface of the upper glass substrate 20 on its side facing towards the organic light-emitting diode structure 30 is formed with a protective layer 50, while the touch control functional layer 40 is formed on a surface of the protective layer 50 away from the upper glass substrate.

In embodiments of the present invention, the protective layer has a thickness of 2.5-3.5 µm. For example, the protective layer has a thickness of 2.5 µm, 2.7 µm, 3.0 µm, 3.2 µm or 3.5 µm.

In the embodiment shown in FIG. 1, the organic light-emitting diode structure 30 comprises: an anode 33, an organic functional layer 32 and a cathode 31, which are arranged in sequence in a direction from the upper glass substrate 20 towards the lower glass substrate 10. The cathode 31 may be made of metal.

Figure 3:
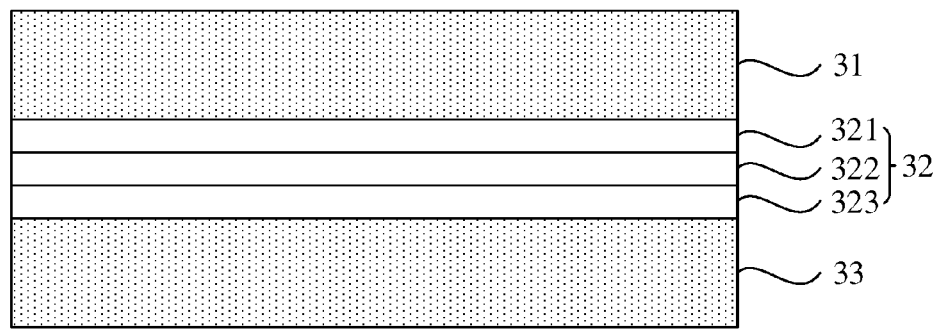
FIG. 3 is a schematic diagram showing a configuration of an organic functional layer in the organic light-emitting diode display panel shown in FIG. 1.

As shown in FIG. 3, in the embodiments of the present invention, the organic functional layer 32 comprises: a hole injection layer 323 disposed on a side of the anode 33 away from the upper glass substrate 20, a light emitting layer 322 disposed on a side of the hole injection layer 323 away from the upper glass substrate 20, and an electron injection layer 321 disposed on a side of the light emitting layer 322 away from the upper glass substrate 20.

Figure 4:
FIG. 4 is a schematic perspective view showing a configuration of an organic light-emitting diode display panel according to a specific embodiment of the present invention applied to a mobile telephone.
Figure 5:
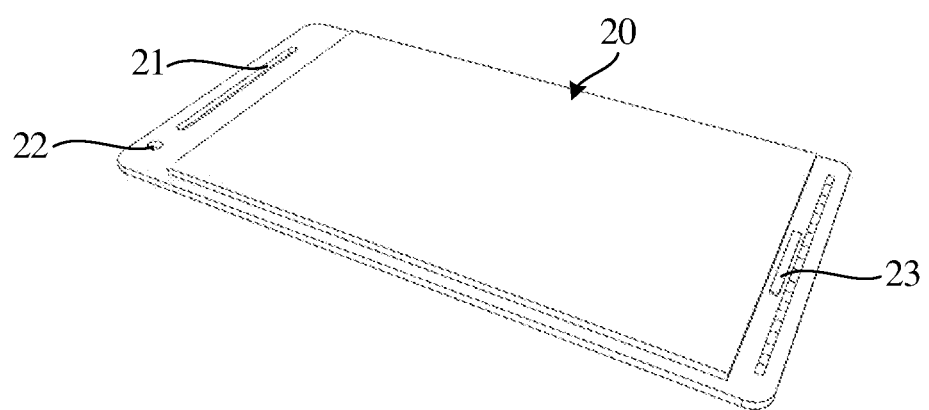
FIG. 5 is a schematic perspective view showing the configuration of the organic light-emitting diode display panel shown in FIG. 4, when viewed from another visual angle.

When the organic light-emitting diode display panel is applied to a mobile telephone, in the embodiment shown in FIGS. 4 and 5, the upper glass substrate 20 may be machined, according to actual requirements on size and shape, to be adapted to various types of mobile telephones. The upper glass substrate 20 may also be formed with a hole 21 for a telephone receiver, a hole 22 for a camera or a pick-up head, and a hole 23 for a key, according to actual requirements.

In the mobile telephone to which the organic light-emitting diode display panel is applied, the upper glass substrate 20 directly serves as a protective glass plate as well as an outermost layer of a screen of the mobile telephone. Compared with a mobile telephone with a conventional structure, in the mobile telephone according to the embodiment of the present invention, a protective glass plate and a bonding layer for bonding the protective glass plate, which would otherwise be provided, are omitted, facilitating thinning design of the mobile telephone, and improving display effect of the mobile telephone since attenuation of light emitted by the organic light-emitting diode structure due to existence of the screen of the mobile telephone is reduced.

In embodiments of the present invention, when the organic light-emitting diode display panel is applied to an electronic apparatus such as a mobile telephone, an edge portion of the upper glass substrate is also formed with a bonding circuit for a drive module and a bonding wire for a flexible circuit board, in order to increase an integration level of the display panel.

Embodiments of the present invention further provide a display apparatus comprising the abovementioned organic light-emitting diode display panel.

The embodiments of the present invention provide the organic light-emitting diode display panel and the display apparatus, which may reduce the number of parts and components of the display panel, optimize a structure of the display panel, decrease a thickness of the display panel, and improve display effect of the display panel.

In the organic light-emitting diode display panel according to the embodiments of the present invention, the upper glass substrate on the light output side of the organic light-emitting diode structure is the strengthened glass plate, subjected to the strengthening processing, which directly serves as the outermost layer of the organic light-emitting diode display panel, to function as a protective glass plate of a common organic light-emitting diode display panel. Therefore, in the organic light-emitting diode display panel according to the embodiments of the present invention, a protective glass plate and a bonding layer for bonding the protective glass plate in a conventional display panel are omitted, which facilitates thinning design of the organic light-emitting diode display panel and reduces attenuation of light emitted by the organic light-emitting diode structure and thus improves display effect of a product.

Although the lower glass substrate 10 is described in the abovementioned embodiments, it may be replaced with a substrate made of any other material than glass.

The above embodiments are only used to explain the present invention, and should not be construed to limit the present invention. It will be understood by those skilled in the art that various changes and modifications may be made therein without departing from the spirit of the present invention, the scope of which is defined in the appended claims and their equivalents.

What is claimed is:

1. An organic light-emitting diode display panel comprising:
    a lower substrate;
    an upper substrate; and
    an organic light-emitting diode structure formed between the lower substrate and the upper substrate, wherein:
        a side of the organic light-emitting diode structure facing towards the upper substrate is a light output side,
        the upper substrate is a strengthened glass plate, subjected to a strengthening processing, which serves as a protective glass plate as an outermost layer of the organic light-emitting diode display panel, and
        the organic light-emitting diode display panel further comprises:
            a touch control function layer disposed on a side of the upper substrate facing towards the organic light-emitting diode structure.

2. The organic light-emitting diode display panel of claim 1, wherein:
    the touch control functional layer comprises a capacitive touch control functional layer, a resistive touch control functional layer or an infrared touch control functional layer.

3. The organic light-emitting diode display panel of claim 1, wherein:
    the upper substrate comprises a glass substrate made of a tempered glass plate, a surface of the upper substrate on the side facing towards the organic light-emitting diode structure is formed with a protective layer, and the touch control functional layer is formed on a surface of the protective layer away from the upper substrate.

4. The organic light-emitting diode display panel of claim 3, wherein:
    the protective layer has a thickness of 2.5-3.5 μm.

5. The organic light-emitting diode display panel of claim 1, wherein:
    the organic light-emitting diode structure comprises: an anode, an organic functional layer and a cathode, which are arranged in sequence in a direction from the upper substrate towards the lower substrate.

6. The organic light-emitting diode display panel of claim 5, wherein:
    the organic functional layer comprises:
        a hole injection layer disposed on a side of the anode away from the upper substrate;
        a light emitting layer disposed on a side of the hole injection layer away from the upper substrate; and
        an electron injection layer disposed on a side of the light emitting layer away from the upper substrate.

7. The organic light-emitting diode display panel of claim 1, wherein:
    the upper substrate is formed with at least one of a hole for a telephone receiver, a hole for a camera or a pick-up head, and a hole for a key.

8. The organic light-emitting diode display panel of claim 1, wherein:
    the lower substrate comprises a glass substrate.

9. A display apparatus comprising:
    the organic light-emitting diode display panel according to claim 1.

10. An organic light emitting diode display panel comprising:
    a lower substrate;
    an upper substrate; and
    an organic light-emitting diode structure formed between the lower substrate and the upper substrate, wherein:
        a side of the organic light-emitting diode structure facing towards the upper substrate is a light output side,
        the upper substrate is a strengthened glass plate, subjected to a strengthening processing, which serves as a protective glass plate as an outermost layer of the organic light-emitting diode display panel, and
        an edge portion of the upper substrate is formed with a bonding circuit for a drive module, and a bonding wire for a flexible circuit board.

11. The organic light-emitting diode display panel of claim 10, further comprising:
    a touch control functional layer disposed on a side of the upper substrate facing towards the organic light-emitting diode structure.

12. The organic light-emitting diode display panel of claim 11, wherein:
    the touch control functional layer comprises a capacitive touch control functional layer, a resistive touch control functional layer or an infrared touch control functional layer.

13. The organic light-emitting diode display panel of claim 11, wherein:
    the upper substrate comprises a glass substrate made of a tempered glass plate, a surface of the upper substrate on the side facing towards the organic light-emitting diode structure is formed with a protective layer, and the touch control functional layer is formed on a surface of the protective layer away from the upper substrate.

14. The organic light-emitting diode display panel of claim 13, wherein:
    the protective layer has a thickness of 2.5-3.5 μm.

15. The organic light-emitting diode display panel of claim 10, wherein:
    the organic light-emitting diode structure comprises: an anode, an organic functional layer and a cathode, which are arranged in sequence in a direction from the upper substrate towards the lower substrate.

16. The organic light-emitting diode display panel of claim 15, wherein:
    the organic functional layer comprises:
        a hole injection layer disposed on a side of the anode away from the upper substrate;
        a light emitting layer disposed on a side of the hole injection layer away from the upper substrate; and
        an electron injection layer disposed on a side of the light emitting layer away from the upper substrate.

17. The organic light-emitting diode display panel of claim 10, wherein:
    the upper substrate is formed with at least one of a hole for a telephone receiver, a hole for a camera or a pick-up head, and a hole for a key.

18. The organic light-emitting diode display panel of claim 10, wherein:
    the lower substrate comprises a glass substrate.

19. A display apparatus comprising:
the organic light-emitting diode display panel according to claim 10.

* * * * *